(12) United States Patent
Miller et al.

(10) Patent No.: US 7,347,530 B2
(45) Date of Patent: Mar. 25, 2008

(54) INKJET PRINTING OF COLOR FILTERS

(75) Inventors: Gershon Miller, Rehovot (IL); Mannie Dorfan, Nes Ziona (IL); Abraham Gross, Ramat Aviv (IL); Ofer Saphier, Rehovot (IL); David Bochner, Ramat Gan (IL)

(73) Assignee: Orbotech Ltd, Yavne (IL)

( * ) Notice: Subject to any disclaimer, the term of this patent is extended or adjusted under 35 U.S.C. 154(b) by 76 days.

(21) Appl. No.: 11/472,551

(22) Filed: Jun. 22, 2006

(65) Prior Publication Data

US 2007/0296758 A1    Dec. 27, 2007

(51) Int. Cl.
B41J 2/15 (2006.01)
(52) U.S. Cl. .......................... 347/41; 347/15
(58) Field of Classification Search ............. 347/15, 347/41, 43, 40, 102
See application file for complete search history.

(56) References Cited

U.S. PATENT DOCUMENTS

| 3,866,237 | A | 2/1975 | Meier |
| 5,847,720 | A | 12/1998 | Dunand |
| 5,956,063 | A | 9/1999 | Yokoi et al. |
| 5,984,470 | A | 11/1999 | Sakino et al. |
| 6,207,948 | B1 | 3/2001 | Yokoi et al. |
| 6,244,702 | B1 | 6/2001 | Sakino et al. |
| 6,367,903 | B1 | 4/2002 | Gast et al. |
| 6,402,282 | B1 | 6/2002 | Webb |
| 6,645,029 | B2 | 11/2003 | Akahira |
| 2002/0001005 | A1* | 1/2002 | Kneezel et al. ............... 347/15 |

FOREIGN PATENT DOCUMENTS

| JP | 54-6538 | | 1/1979 |
| JP | 54-74435 | A | 6/1979 |
| JP | 8-292319 | A | 11/1996 |
| JP | 10-253814 | A | 9/1998 |
| JP | 11-2711 | A | 1/1999 |
| JP | 11-14816 | A | 1/1999 |
| JP | 11-64626 | A | 3/1999 |
| JP | 11-258416 | A | 9/1999 |
| JP | 2001-108820 | A | 4/2001 |
| JP | 2001-124923 | A | 5/2001 |

* cited by examiner

Primary Examiner—Lamson Nguyen
(74) Attorney, Agent, or Firm—Sughrue Mion, PLLC

(57) ABSTRACT

A method for printing includes providing a substrate on which a matrix of color elements is defined, the color elements having respective center lines. A printhead assembly is positioned over the substrate. The printhead assembly includes multiple controllable nozzles. At least one of the substrate and the printhead assembly is translated so that the printhead assembly scans over the substrate in a scan direction transverse to the center lines of the color elements. Droplets of ink are ejected from the nozzles onto the substrate at selected times while the printhead assembly scans over the substrate. The times at which to eject the droplets are selected so as to cause the droplets to land on the color elements at respective locations, such that respective locations are displaced from the center lines.

10 Claims, 5 Drawing Sheets

INKJET PRINTING OF COLOR FILTERS

FIELD OF THE INVENTION

The present invention relates generally to inkjet printing, and specifically to production of flat panel displays using inkjet technology.

BACKGROUND OF THE INVENTION

To produce a color flat panel display, a matrix of light-modulating elements, such as a liquid crystal display (LCD), is overlaid by a corresponding matrix of color elements. Each color element filters the light that passes through the corresponding light-modulating element and thus enables the display to present color images.

U.S. Pat. No. 6,645,029, whose disclosure is incorporated herein by reference, describes a method and apparatus for producing color filters by ejecting ink onto a substrate from a plurality of nozzles in an inkjet head. The nozzles are arranged in a first direction, and the inkjet head is scanned relative to the substrate in a second, perpendicular direction. Thus, filter elements adjacent in the second direction may be colored with different colors. Ejection timings for the nozzles are adjusted so that the ink dots land along the center line of each of the filter elements in the first direction. This technique is said to reduce the occurrence of color mixing.

SUMMARY OF THE INVENTION

Embodiments of the present invention provide methods and apparatus for printing matrices of color elements. These methods and apparatus are useful particularly in producing filter overlays, OLED elements and the like for color flat panel displays, but they may similarly be used in other large-scale inkjet printing applications.

In disclosed embodiments, a printhead assembly comprising multiple nozzles is scanned relative to a substrate in a scan direction generally transverse to color elements to be formed, and droplets of ink are ejected from the nozzles at selected times during the scan. The times at which to eject the droplets are selected and controlled so as to cause the droplets to land at respective locations on designated color elements, such that respective locations are displaced from the center lines of the color elements. This displacement is useful in ensuring that the ink spreads evenly over the color element by compensating for factors such as the fluid dynamics of the ejected droplets, as well as electrostatic and hydrostatic interaction between droplets and ink that has already been deposited on the substrate.

As used in this disclosure, the term "ink" includes without limitation inks employed in the production of color filters as well as polymer materials, such as polymer materials responsive to electric signals to emit light as are employed in OLED type displays.

There is therefore provided, in accordance with an embodiment of the present invention, a method for printing, including:

providing a substrate on which a matrix of color elements is defined, the color elements having respective center lines;

positioning a printhead assembly over the substrate, the printhead assembly including multiple controllable nozzles;

translating at least one of the substrate and the printhead assembly so that the printhead assembly scans over the substrate in a scan direction transverse to the center lines of the color elements;

ejecting droplets of ink from the nozzles onto the substrate at selected times while the printhead assembly scans over the substrate; and selecting the times at which to eject the droplets so as to cause the droplets to land on the color elements at respective locations, such that respective locations are displaced from the center lines.

In a disclosed embodiment, providing the substrate includes creating elevated borders on the substrate surrounding and defining the color elements, and ejecting the droplets includes directing the droplets to contact the borders.

Typically, the color elements are arranged in rows along a direction transverse to the scan direction, and ejecting the droplets includes coloring successive, neighboring rows with different, respective colors in alternation.

In disclosed embodiments, ejecting the droplets includes actuating the nozzles so as to deposit two or more of the droplets on each of the color elements during a single pass of the printhead over the color elements. The nozzles may be actuated to deposit the two or more of the droplets side by side along an axis transverse to the scan direction or, alternatively or additionally, in succession along the scan direction. Typically, actuating the nozzles includes depositing the two or more of the droplets so that the two or more of the droplets overlap and coalesce within each of the color elements on the substrate. In some embodiments, the printhead assembly includes multiple, staggered printheads, each including a respective plurality of the nozzles, and actuating the nozzles includes ejecting the two or more of the droplets from different ones of the printheads.

Typically, selecting the times includes displacing the droplets from the center lines so as to compensate for motion of the printhead assembly relative to the substrate. Additionally or alternatively, selecting the times includes determining the respective locations responsively to a repulsion between the droplets and at least one of the ink already deposited on the substrate and the ink in other droplets.

In a disclosed embodiment, the substrate includes a glass, and wherein ejecting the droplets includes coloring the color elements so as to serve as a filter overlay for a flat panel display. Additionally and alternatively, ejecting the droplets includes ejecting a polymer ink that is responsive to electrical signals to selectively emit colored light.

The printhead assembly may include multiple printing units, each including a respective plurality of the nozzles, wherein the printing units are distributed along the printhead assembly, and the method may include associating a respective cleaning unit with each of the printing units and, after scanning the printhead assembly over the substrate, cleaning excess ink off each of the printing units using the respective cleaning unit.

There is also provided, in accordance with an embodiment of the present invention, a method for printing, including:

providing a substrate on which a matrix of color elements is defined;

positioning a printhead assembly over the substrate, the printhead assembly including multiple controllable nozzles;

translating at least one of the substrate and the printhead assembly so that the printhead assembly scans over the substrate in a scan direction;

ejecting droplets of ink from the nozzles onto the substrate at selected times while the printhead assembly scans over the substrate so as to deposit two or more of the droplets on each of the color elements during a single pass of the printhead over the color elements; and selecting the times at which to eject the droplets so as to cause the droplets to land on the color elements so that the two or more of the droplets overlap and coalesce within each of the color elements on the substrate.

Typically, the two or more of the droplets are deposited within a time limit that is determined responsively to a drying rate of the ink. In disclosed embodiments, the time limit is no greater than 200 ms, and may be no greater than 20 ms.

In a disclosed embodiment, the printhead assembly includes one or more printing units, each printing unit including multiple, staggered printheads for ejecting the droplets of ink of a given color, each printhead including a respective plurality of the nozzles, and actuating the nozzles includes ejecting the two or more of the droplets from different ones of the printheads. Typically, the nozzles in each of the multiple, staggered printheads in each printing unit are displaced by respective offsets in a direction transverse to the scan direction, and in one embodiment, the respective offsets do not increase monotonically across the printing unit.

There is additionally provided, in accordance with an embodiment of the present invention, apparatus for printing on a substrate on which a matrix of color elements is defined, the color elements having respective center lines, the apparatus including:

a printhead assembly, which is arranged to be positioned over the substrate, the printhead assembly including multiple controllable nozzles;

a translation assembly, which is arranged to translate at least one of the substrate and the printhead assembly so that the printhead assembly scans over the substrate in a scan direction transverse to the center lines of the color elements; and a controller, which is coupled to drive the printhead assembly to eject droplets of ink from the nozzles onto the substrate at selected times while the printhead assembly scans over the substrate, while selecting the times at which to eject the droplets so as to cause the droplets to land on the color elements at respective locations, such that respective locations are displaced from the center lines.

There is further provided, in accordance with an embodiment of the present invention, apparatus for printing on a substrate on which a matrix of color elements is defined, the apparatus including:

a printhead assembly, which is arranged to be positioned over the substrate, the printhead assembly including multiple controllable nozzles;

a translation assembly, which is arranged to translate at least one of the substrate and the printhead assembly so that the printhead assembly scans over the substrate in a scan direction; and a controller, which is coupled to drive the printhead assembly to eject droplets of ink from the nozzles onto the substrate at selected times while the printhead assembly scans over the substrate so as to deposit two or more of the droplets on each of the color elements during a single pass of the printhead over the color elements, while selecting the times at which to eject the droplets so as to cause the droplets to land on the color elements so that the two or more of the droplets overlap and coalesce within each of the color elements on the substrate.

The present invention will be more fully understood from the following detailed description of the embodiments thereof, taken together with the drawings in which:

DETAILED DESCRIPTION OF EMBODIMENTS

Figure 1:
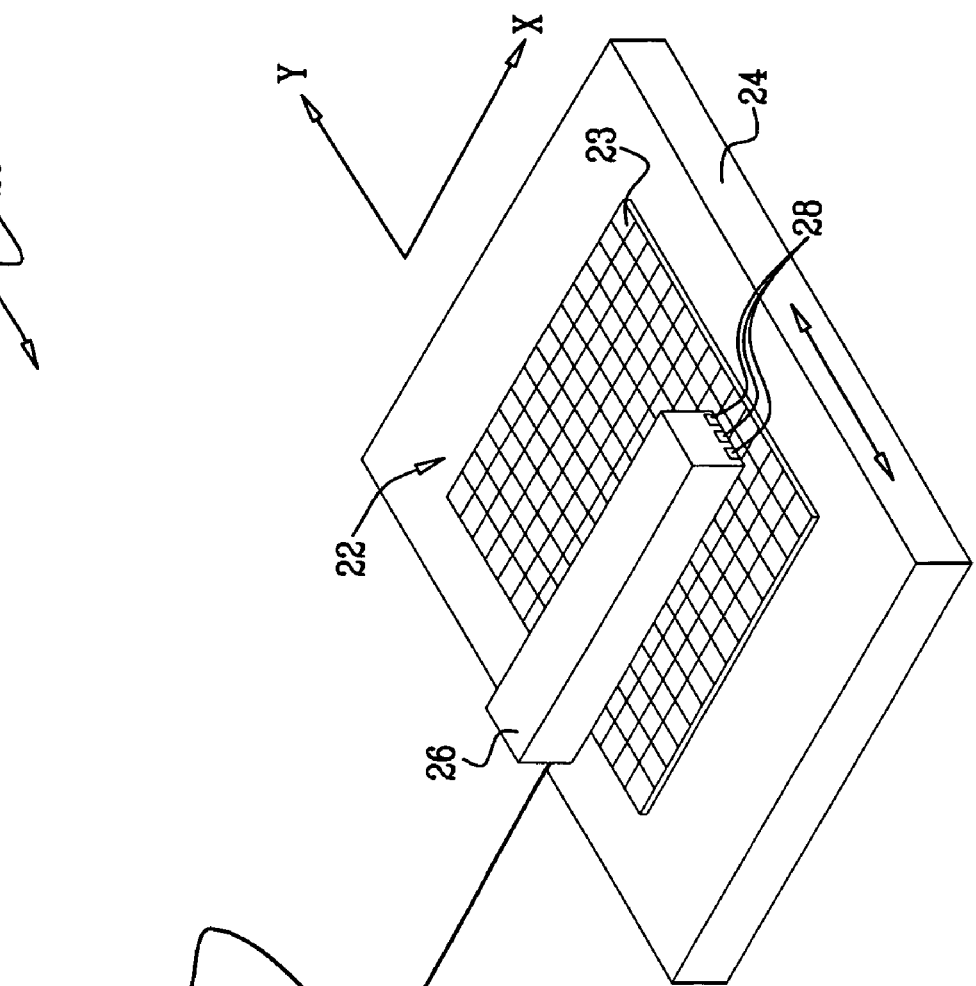
FIG. 1 is a schematic, pictorial illustration showing apparatus for printing a matrix of color elements, in accordance with an embodiment of the present invention.
Figure 1:
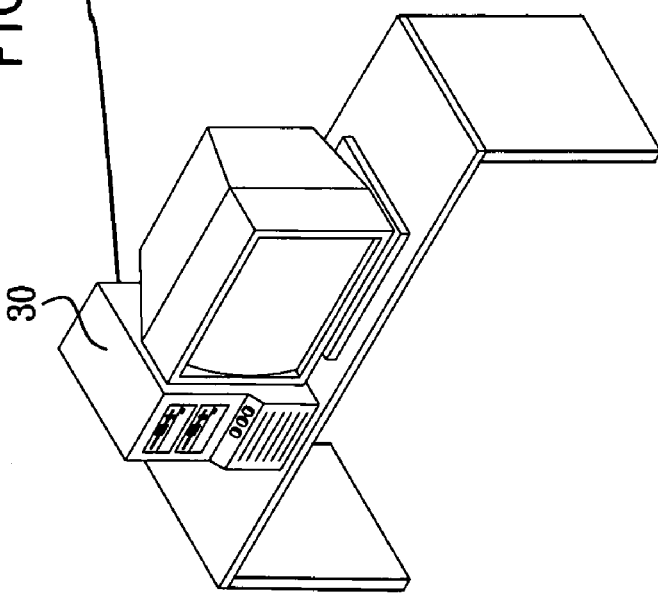

FIG. 1 is a schematic, pictorial illustration showing apparatus 20 for printing a matrix of color elements on a substrate 22, in accordance with an embodiment of the present invention. A printhead assembly 26, comprising multiple printing units 28, is positioned over substrate 22. Each printing unit comprises multiple inkjet nozzles, which are configured to eject inks, such as colored inks, onto substrate 22 to form color elements 23, as shown in the figures that follow and described in detail hereinbelow. Once the printing process has been completed, the substrate may be used, for example, as a color filter overlay on a conventional flat panel display or as an OLED type flat panel display.

A translation assembly causes printhead assembly 26 to scan over substrate 22 in a scan direction, which is taken arbitrarily to be the Y-direction. In this embodiment, the translation assembly comprises a translation stage 24, such as an air table, on which substrate 22 is mounted. An exemplary air float conveyor system of this sort is described in U.S. Pat. No. 6,810,297, whose disclosure is incorporated herein by reference. (The air float may also be used to heat substrate 22, in order to speed the drying of the ink and improve adhesion on the substrate.) Optionally, the translation stage is also configured to translate the substrate in the X-direction, so that different parts of the substrate may be covered by the inkjet nozzles during successive Y-direction scans. Alternatively or additionally, the translation assembly may move the printhead assembly. Mechanical elements not essential to an understanding of the present invention, such as components of the translation assembly and components used in mounting and supplying inks to the printhead assembly and in transporting substrate 22, are omitted from the figures for the sake of simplicity.

A control console 30 controls the scan of printhead assembly 26 over substrate 22 and drives the ejection of ink droplets from the printing unit nozzles. The ejection timing is precisely controlled so that the droplets land at the desired location on each color element 23. Methods used for this purpose are described further hereinbelow. Optionally, system 20 comprises an optical inspection unit (not shown), such as a miniature digital camera, for checking the accuracy of alignment of the ink droplets deposited on the substrate. For example, the control console may command the printhead assembly to print a line of test spots at one or more predetermined target locations, typically near the edge of the substrate. If the optical inspection unit detects a deviation between the actual locations of the spots and the target locations, console 30 may adjust the timing and/or other parameters of ink ejection in order to correct the deviation. The inventors have developed techniques, as explained further hereinbelow, that promote self-alignment of the multiple droplets that are deposited in each color element 23. When these techniques are used, the inventors have found in many cases that measurement of and correction for global average deviations, such as average shift, scaling and rotation of ink ejection by printhead units 28, provide acceptable printing results over the entire substrate, without the need for local measurement and correction of printing of individual color elements or groups of color elements. Alternatively, localized measurement and correction of deviations may be used when necessary.

Figure 2:
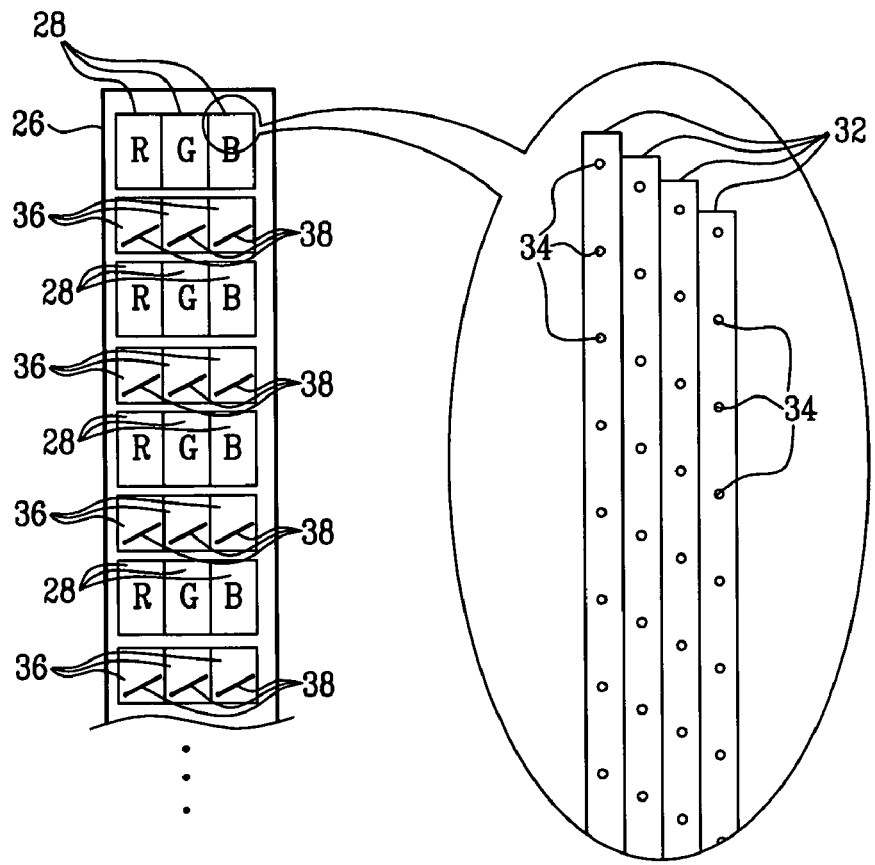
FIG. 2 is a schematic bottom view of a printhead assembly, in accordance with an embodiment of the present invention.

FIG. 2 is a schematic bottom view of printhead assembly 26, showing the side of the assembly that faces substrate 22, in accordance with an embodiment of the present invention. Assembly 26 comprises multiple printing units 28, each comprising multiple printheads 32, with ink ejection nozzles 34. In a typical embodiment, each printing unit comprises ten printheads, which are stacked side-by-side in the scan (Y) direction as shown in the figure. Printheads 32 in each printing unit are staggered, as shown in the figure, so that nozzles 34 are mutually offset in the transverse (X) direction. As a result, the effective pitch (spot-to-spot distance) of the printhead unit in the transverse direction is very fine and may be made smaller than the actual droplet diameter. The ink may then be printed on substrate 22 in a dense swath of overlapping spots, as described further hereinbelow. (The actual number of printheads in each unit and the X-direction offset may be determined according to the spot size, the desired degree of overlap, the sequence of droplet ejection, and the spacing between nozzles 34. An alternative arrangement of the printheads is shown in FIG. 4B and described hereinbelow.) Printheads 32 may be fixed parallel to the X-direction, since the configuration shown here obviates the need to angle the printheads in order to match the pitch of the color elements on the substrate as in some systems known in the art.

Because of the stacked and staggered design shown in FIG. 2, printheads 32 may comprise conventional, off-the-shelf inkjet printheads. Examples of such printheads include Ricoh E1 Drop on Demand 96 (Ricoh Printing Systems America, Inc., Simi Valley, Calif.); Spectra SX-128 (Dimatix Spectra Printing Division, Lebanon, N.H.); and Xaar XJ500 (Xaar plc, Cambridge, United Kingdom). In all, printhead assembly 26 may comprise tens of thousands of nozzles 34, which are individually controlled by console 30 to eject a "drop on demand" with precisely-controlled timing and/or drop volume and/or drop velocity. The timing is controlled in order to compensate, inter alia, for the relative offsets of printheads 32 in the Y-direction and for the need to deposit droplets precisely within the desired color elements 23, as described hereinbelow.

In the embodiment shown in FIG. 2, printing units 28 are grouped together in modules, each comprising one printing unit for each of the primary colors (red, green and blue). As printhead assembly 26 scans over substrate 22, the nozzles of each color are actuated at the appropriate times to print the different color elements. For reasons of cost reduction, packaging, and convenience in cleaning the printheads, inter alia, the printing units may be spaced apart along the X-axis as shown in the figure. In this case, in order to cover the entire surface of the substrate, two or more Y-direction scan passes are used, with the printhead assembly offset in the X-direction between successive passes so that on the second scan the printing units cover gaps left between the printing units in the first scan. In an embodiment, the printhead assembly and scan pattern are designed so that one third of the substrate is covered in each of three successive scan passes in the Y-direction. For enhanced throughput, the first and third passes may be in one direction, with the second pass in the opposite direction. Additionally or alternatively, in successive passes nozzles in the printhead units may be activated to cover the same areas of the substrate in order to deposit two or more layers of ink in each color element. Multi-layer printing in this fashion may enhance the uniformity of the color elements.

When printing units 28 are spaced apart as shown in FIG. 2, cleaning modules 36 may be interleaved between the printing units. Each cleaning module comprises a wiper blade 38. Typically, the cleaning modules are activated, after a predetermined number of scans or in case of erratic print-head operation, as part of a flushing and cleaning procedure to clean off excess ink that may have accumulated on the printheads. During this cleaning procedure, each blade 38 typically slides over the corresponding printing unit 28 in order to wipe the excess ink into a "spittoon" (not shown), located for example, at the end of stage 24. This sort of cleaning is useful in maintaining optimal printing resolution, since excess ink can adversely affect the direction and velocity of droplets that are ejected from the printheads. The cleaning procedure may be followed by a printing quality test after each scan or after completing the printing of each panel, or after several scans or panels, although this need not be the case.

Figure 3:
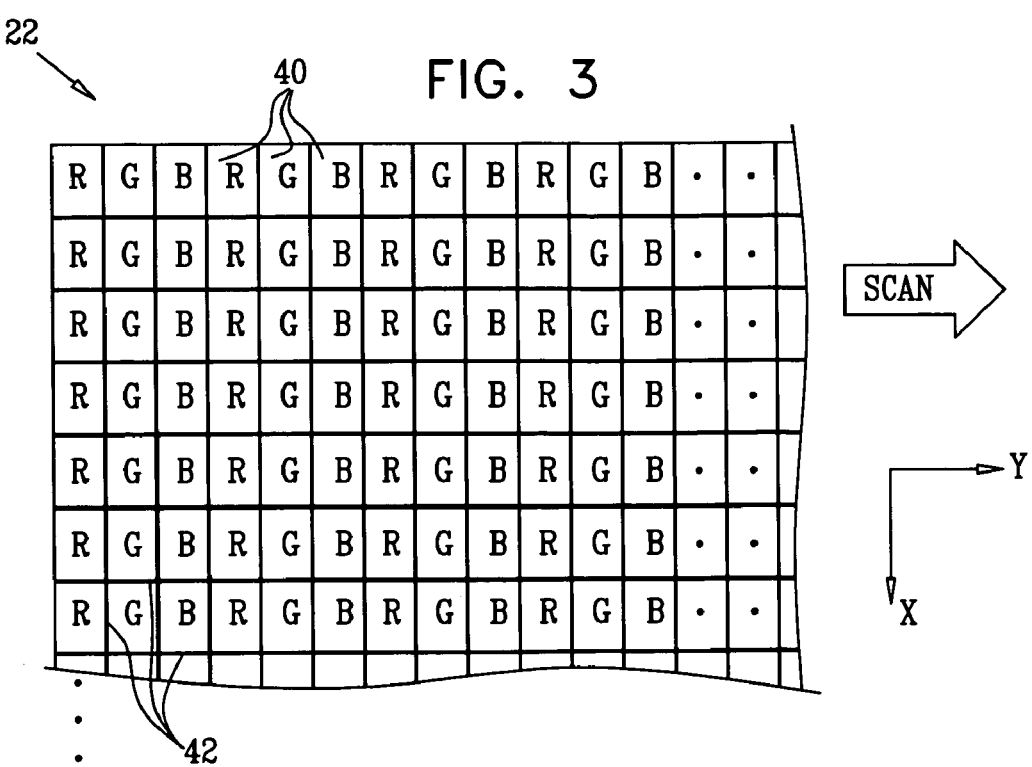
FIG. 3 is a schematic detail view of a matrix of color elements, which is printed in accordance with an embodiment of the present invention.

FIG. 3 is a simplified schematic view of a matrix of color elements 40 printed on substrate 22, in accordance with an embodiment of the present invention. The color elements in this embodiment are arranged in rows of red, green and blue along the X-direction, as is common in matrices of color elements that are used with flat panel displays. More generally, the color elements may have substantially any suitable polygonal shape, such as "zigzag" and "boomerang" shapes that are known in the art. The color elements are separated from their neighbors by borders 42, which are commonly referred to as a "black matrix." In accordance with an embodiment, a phantom border, known as a "bank matrix", that is not opaque, is provided to delineate among color elements. These borders are deposited on substrate 22 and protrude slightly above the substrate surface, thus defining recesses into which the ink is injected by printing apparatus 20. Alternatively, the apparatus and methods described herein may be used in depositing color elements that are predefined geometrically in the program of console 30 without reliance on borders of this sort.

Typically, the color elements defined by borders 42 are elongated in the X-direction, transverse to the scan, relative to their Y-direction dimension. (In other words, the long dimension of the color elements is aligned with the long dimension of printheads 32 and is transverse to the scan direction.) In embodiments, the center-to-center spacing between adjacent color elements is between 210 and 600 μm in the X-direction and between 70 and 200 µm in the Y-direction. Alternatively, apparatus 20 may be adapted to print matrices of larger or smaller color elements.

On the basis of FIGS. 2 and 3, it can be seen that as printhead assembly 26 scans over substrate 22, nozzles 34 in each printhead 32 in red printing units 28 will be triggered to eject drops as the printhead passes over the row of red color elements 40. The nozzles in the green and blue printhead units will be triggered accordingly over their respective rows. As the printhead then scans over the other rows (of different colors), the nozzles of the non-corresponding colors are shut off. During this interval, the ink at each nozzle is replenished, and maintenance procedures (for example phantom operation of the nozzles) are performed on the nozzles as necessary.

The droplets from adjacent nozzles in a given printing unit are typically all deposited in the color element within less than one second, overlapping in the X-direction. The droplets thus create a dense swath of liquid ink, which coalesces to create a uniform fluid layer over the entire color element. In general, the time between deposition of the droplets in a color element is limited by the drying rate (i.e., the evaporation rate of the volatile components) of the ink: For good coalescence, it is desirable that each successive droplet be deposited before the adjacent droplet or droplets have dried sufficiently to adhere to the substrate. Depending on the ink characteristics, it is usually necessary to deposit adjacent droplets within 200 ms of one another, and the optimal maximum time between deposition of adjacent droplets may be no greater than 20 ms. Longer delays in deposition of adjacent droplets may cause non-uniform distribution and drying and result in defects. Thus, in embodiments of the present invention, system 20 is designed and programmed so that the timing of deposition of the adjacent droplets is determined responsively to the evaporation rate of the ink droplets on substrate 22.

Figure 4A:
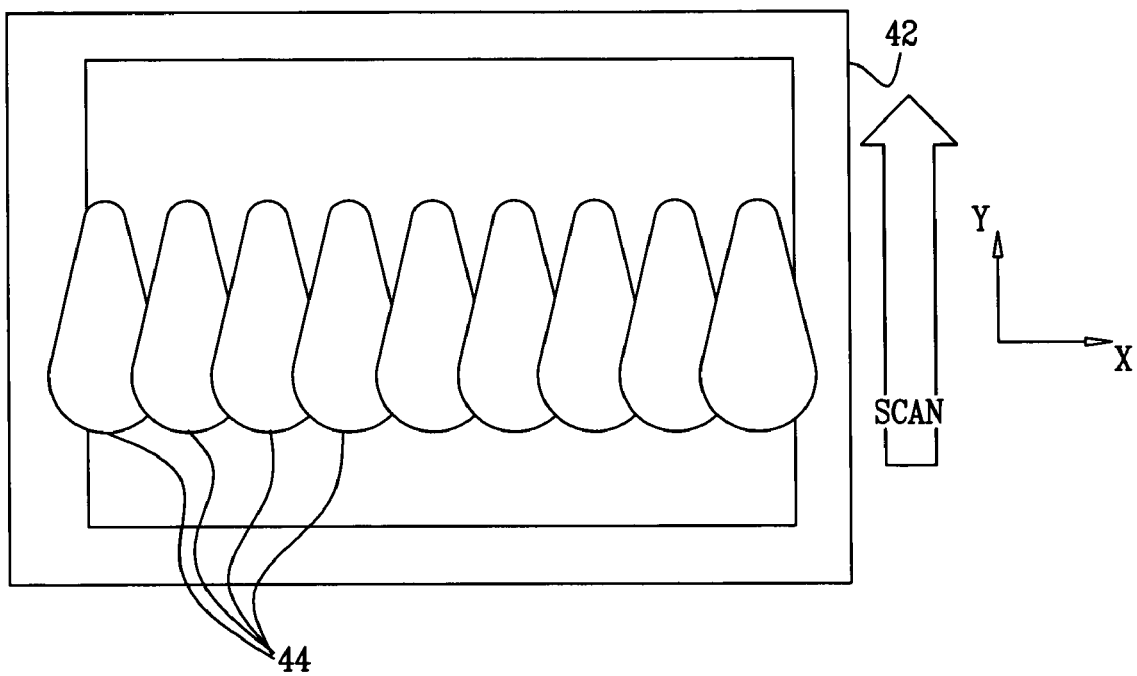
FIG. 4A is a schematic detail view of a single color element showing deposition of ink droplets thereon, in accordance with an embodiment of the present invention.
Figure 4B:
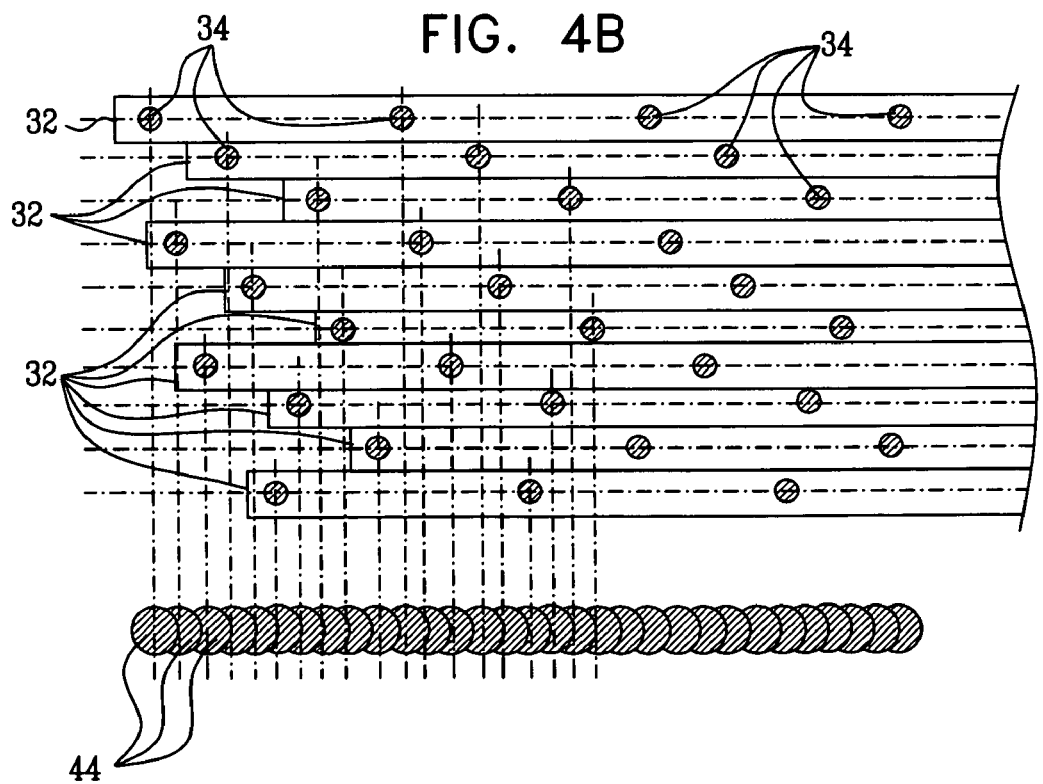
FIG. 4B is a schematic bottom view of a printhead assembly, in accordance with another embodiment of the present invention.

FIG. 4A is a simplified schematic detail view of one color element 40, showing deposition of droplets 44 of ink within borders 42 of the color element, in accordance with an embodiment of the present invention. Each droplet 44 typically comprises between 20 and 50 pl (pico-liters) of ink. A 33 pl droplet of ink, for example, will have dimensions in air (in transit between the nozzle and the substrate surface) of about 30 µm diameter by 60 µm height. Assuming that borders 42 define a recess of width (in the X-direction) 300 µm, for example, approximately nine of these droplets, spaced 34 µm apart center-to-center along an axis transverse to the scan direction, will cover the width of the recess with adequate overlap.

Timing of droplet ejection by nozzles 34 is controlled so that in the Y-direction, droplets 44 are intentionally deposited to one side of the center line of the color element. Specifically, in this example, the droplets are aimed to land to one side of the center line and spread across the center line because of the scan motion. Considerations of importance in determining the landing point (and hence ejection timing) of the droplets are further described hereinbelow. If the Y-dimension of the color elements is sufficiently small, relative to the volume of the droplets, then a single row of droplets, as shown in FIG. 4A, may be sufficient to spread over the entire surface of each color element. Alternatively, elements that are wider in the Y-direction may require that each nozzle 34 release two or more successive droplets per color element 40. For example, the inventors have found that a single row of 33 pl droplets is sufficient to cover color elements that are up to about 100 µm wide in the Y-direction, whereas two rows of droplets give better results when the color elements are about 120 µm wide for example.

The inventors have also discovered that densely-spaced droplets, such as those shown in FIG. 4A, tend to align with one another on the substrate, as long as the adjacent droplets are deposited within the time limits described above. As a result, in calibrating and adjusting the ejection timing of the nozzles, it may be sufficient simply to calibrate the timing of the entire printhead to compensate for average deviation factors (such as shift, scaling and rotation), rather than calibrating and adjusting the timing of each nozzle individually. Alternatively, for very high precision, a timing correction may be determined and applied for each nozzle.

FIG. 4B is a schematic bottom view of one of printing units 28, in accordance with another embodiment of the present invention. In this embodiment, the printing unit comprises ten printheads 32, which are staggered in a complex pattern. In this pattern, the offset of nozzles 34 (relative to the nozzles in the first printhead) does not increase monotonically across the printing unit, unlike the simple stagger pattern shown in FIG. 2. The timing of droplet ejection from each printhead 32 is controlled, relative to the scan velocity of printhead assembly 26, so that droplets 44 form a single, dense swath of ink, as shown at the bottom of FIG. 4B. The complex stagger pattern is advantageous in ensuring that the time elapsed between deposition of each droplet and the deposition of the adjacent droplets (from other printheads) is less than the time limit imposed by the drying rate of the ink.

Figure 5A:
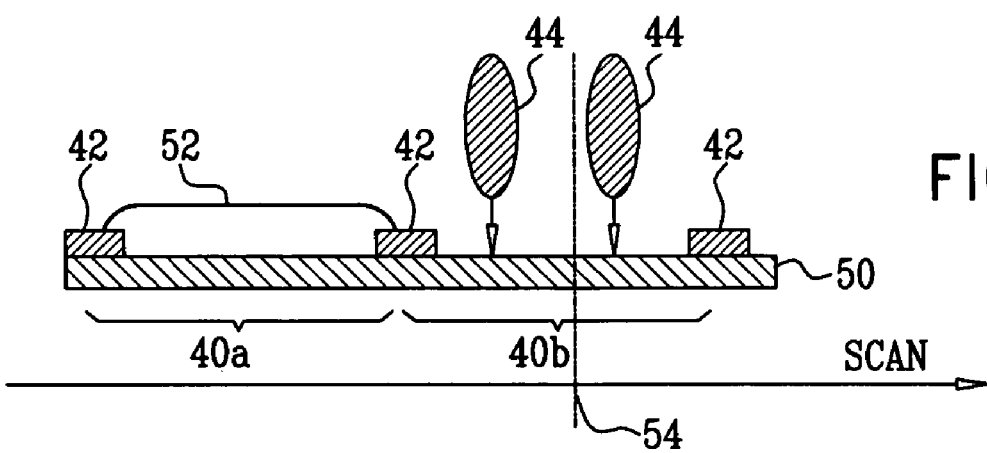
FIGS. 5A-5C are schematic, sectional views of a pair of color elements during successive stages in the deposition of ink droplets on one of the elements, in accordance with an embodiment of the present invention.
Figure 5B:
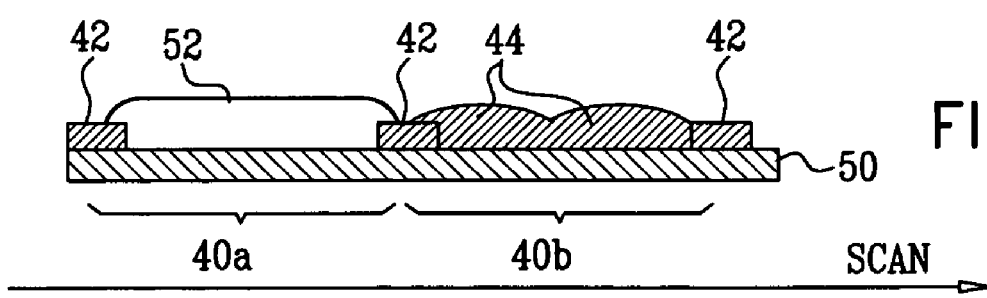
Figure 5C:
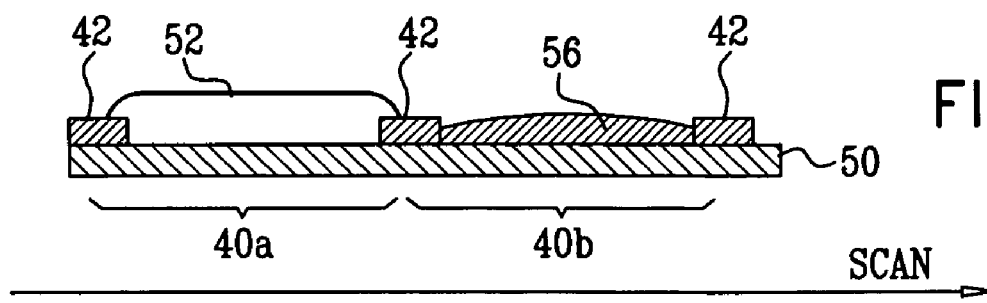

FIGS. 5A-5C are schematic, sectional views of a pair of color elements 40a, 40b during successive stages in the deposition of ink droplets on element 40b, in accordance with an embodiment of the present invention. These figures show a cross-section in the Y-Z plane, with the scan (in the Y-direction) moving to the right.

In preparation for printing the color elements, borders 42 are deposited on a base layer 50, which typically comprises glass. The borders typically comprise a suitable polymer containing opaque black pigment, such as PSK™2000 black matrix resin, distributed by Brewer Science (Rolla, Mo.), which is deposited on the base layer to a thickness between about 1.2 and 1.4 µm. Alternatively, borders of different types and thickness may be used, for example non-opaque "bank matrix" borders, or the color elements may be printed without pre-deposited borders, as noted above.

In the example shown in FIGS. 5A-5C, it is assumed that color element 40a has already been printed, and is thus filled with ink 52 that has dried. As seen in FIGS. 5A-5C, the formation of ink 52 includes at least two coats of ink resulting the ink being at a height that is above borders 42. The ink may comprise, for example, a Brewer Science color filter resin, similar in composition to photoresist materials known in the art. The resin is typically modified by addition of a volatile additive, such as BYK®-358 N acrylic additive (BYK Chemie, Wesel, Germany) for improved leveling. Alternatively, the ink may comprise, for example, a polymer resin that emits light in response to electrical signals as used form OLED elements.

Optionally, for enhanced adhesion and homogeneity of the ink, an intermediate layer (not shown) is deposited on base layer 50 and borders 42 before printing of the color elements. The inventors have found, however, that when the techniques described herein are used, the intermediate layer is not required. Rather, as long as the ink droplets come into contact with border 42 all around the edges of the color element, the borders act as a sort of "tent peg," drawing the ink into the interface between the borders and the base layer and thus ensuring homogeneous ink coverage. For this reason, it is desirable that the ink droplets slightly overlap the borders, as shown in FIGS. 4A, 4B and 5B.

The width of color elements 40a, 40b in the scan direction in FIGS. 5A-5C is such that two rows of droplets 44 are required in order to cover the entire width, as shown in the figure. Typically, the ejection timing of nozzles 34 is controlled so that the droplets are deposited to either side of a transverse (X-direction) center line 54 of element 40b, as shown in FIG. 5A.

The inventors have found, furthermore, that there is a repulsive effect between ink 52 that has previously been deposited in one color element (such as element 40a in these figures) and fresh ink deposited in the neighboring color element (element 40b). Thus, droplets 44 are not deposited symmetrically about center line 54, but are rather displaced laterally, as shown in FIG. 5A, in order to compensate for the repulsive effect. The relative spacing between droplets 44 may also be adjusted, typically by decreasing the time between ejection of successive droplets, in order to compensate for mutual repulsion between the droplets.

Immediately following deposition of droplets 44 on base layer 50, the droplets spread laterally, as shown in FIG. 5B, and contact borders 42 on all sides of color element 40b. This spreading stage is typically completed within about 0.1 sec of droplet deposition. Droplets 44 subsequently dry to form an ink layer 56 that is approximately uniform in thickness, as shown in FIG. 5C. The ink volume contracts due to evaporation of volatile components of the ink during drying. As noted above, for enhanced uniformity, an additional ink layer may subsequently be printed over layer 56.

Thus, to summarize, the ejection timing of nozzles 34 is adjusted so as to take the following factors into account:
  Elongation of the droplet in the scan direction due to length of ejected drop and motion of printhead assembly 26 relative to substrate 22.
  Repulsive forces due to ink already deposited in neighboring color elements (or alternatively, the absence of such forces when neighboring elements have not yet been printed).
  Geometry of borders 42.

Optimal drop positions under given conditions of color element size and status of neighboring color elements may be computed from first principles or determined empirically based on trial deposition under different conditions.

Figure 6:
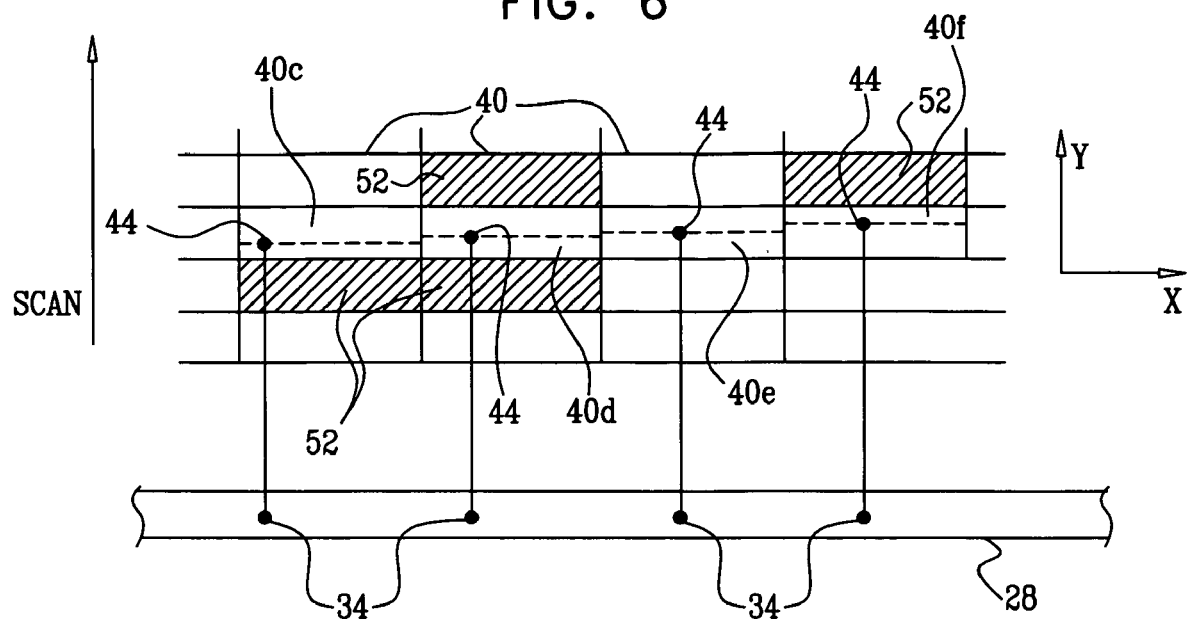
FIG. 6 is a schematic detail view of a matrix of color elements showing locations for deposition of ink droplets thereon, in accordance with an embodiment of the present invention.
Figure 7:
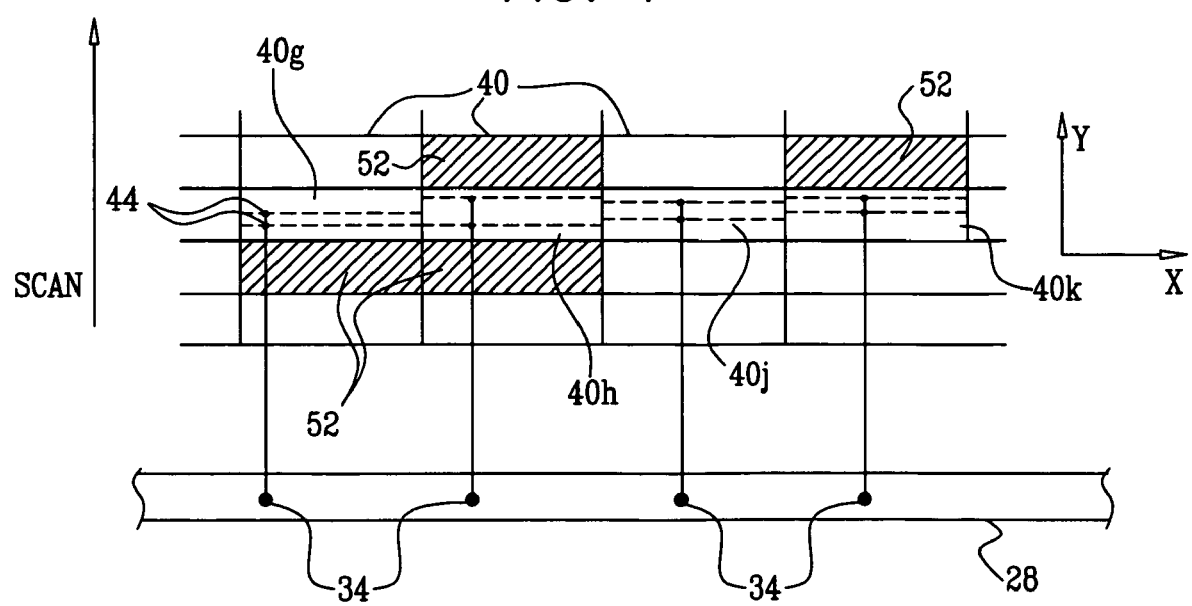
FIG. 7 is a schematic detail view of a matrix of color elements showing locations for deposition of ink droplets thereon, in accordance with another embodiment of the present invention.

FIGS. 6 and 7 are schematic detail views of matrices of color elements 40, showing locations for deposition of ink droplets 44 thereon by nozzles 34, based on the principles outlined above, in accordance with an embodiment of the present invention. FIG. 6 shows color elements 40c, 40d, 40e and 40f, in which a single droplet 44 is deposited in the Y direction during scan of nozzles 34 over each color element. FIG. 7 shows color elements 40g, 40h, 40j and 40k, on which the respective nozzles deposit two successive droplets 44 in the Y direction on each color element during each scan. The location of the droplets in each case can be seen to depend on the presence or absence of ink 52 in color elements 40 to either side of the present row. In FIG. 7, the mutual proximity of the two droplets in each color element is also adjusted. The droplets are aimed for deposit off center, taking into account various forces acting on the droplets.

Although the embodiments described above relate specifically to printing of color filters for display applications, the principles of the present invention may similarly be used in other large-scale inkjet printing applications. It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for printing, comprising:
  providing a substrate on which a matrix of color elements is defined, the color elements having respect center lines;
  positioning a printhead assembly over the substrate, the printhead assembly comprising multiple controllable nozzles;
  translating at least one of the substrate and the printhead assembly so that the printhead assembly scans over the substrate in a scan direction transverse to the center lines of the color elements;
  ejecting droplets of ink from the nozzles onto the substrate at selected times while the printhead assembly scans over the substrate; and
  selecting the times at which to eject the droplets so that the droplets are aimed to land on the color elements at respective locations, to a side of the center lines;
  wherein ejecting the droplets comprises actuating the nozzles so as to deposit two or more of the droplets on each of the color elements during a single pass of the printhead over the color elements;
  wherein actuating the nozzles comprises depositing the two or more of the droplets so that the two or more of the droplets overlap and coalesce within each of the color elements on the substrate; and
  wherein the two or more of the droplets are deposited within a time limit that is determined responsively to a drying rate of the ink.

2. A method for printing, comprising:
  providing a substrate on which a matrix of color elements is defined, the color elements having respective center lines;
  positioning a printhead assembly over the substrate, the printhead assembly comprising multiple controllable nozzles;
  translating at least one of the substrate and the printhead assembly so that the printhead assembly scans over the substrate in a scan direction transverse to the center lines of the color elements;
  ejecting droplets of ink from the nozzles onto the substrate at selected times while the printhead assembly scans over the substrate; and
  selecting the times at which to eject the droplets so that the droplets are aimed to land on the color elements at respective locations, to a side of the center lines;
  wherein selecting the times comprises determining the respective locations responsively to a repulsion between the droplets and at least one of the ink already deposited on the substrate and the ink in other droplets.

3. A method for printing, comprising:
  providing a substrate on which a matrix of color elements is defined;
  positioning a printhead assembly over the substrate, the printhead assembly comprising multiple controllable nozzles;
  translating at least one of the substrate and the printhead assembly so that the printhead assembly scans over the substrate in a scan direction;

ejecting droplets of ink from the nozzles onto the substrate at selected times while the printhead assembly scans over the substrate so as to deposit two or more of the droplets on each of the color elements during a single pass of the printhead over the color elements; and selecting the times at which to eject the droplets so as to cause the droplets to land on the color elements so that the two or more of the droplets overlap and coalesce within each of the color elements on the substrate;

wherein the two or more of the droplets are deposited within a time limit that is determined responsively to a drying rate of the ink.

4. The method according to claim 3, wherein the time limit is no greater than 200 ms.

5. The method according to claim 4, wherein the time limit is no greater than 20 ms.

6. Apparatus for printing on a substrate on which a matrix of color elements is defined, the color elements having respective center lines, the apparatus comprising:

a printhead assembly, which is arranged to be positioned over the substrate, the printhead assembly comprising multiple controllable nozzles;

a translation assembly, which is arranged to translate at least one of the substrate and the printhead assembly so that the printhead assembly scans over the substrate in a scan direction transverse to the center lines of the color elements; and a controller, which is coupled to drive the printhead assembly to eject droplets of ink from the nozzles onto the substrate at selected times while the printhead assembly scans over the substrate, while selecting the times at which to eject the droplets so as to cause the droplets to land on the color elements at respective locations, such that respective locations are displaced from the center lines;

wherein the controller is operative to drive the printhead assembly so that the nozzles deposit two or more of the droplets on each of the color elements during a single pass of the printhead over the color elements;

wherein the two or more of the droplets are deposited so as to overlap and coalesce within each of the color elements on the substrate; and wherein the two or more of the droplets are deposited within a time limit that is determined responsively to a drying rate of the ink.

7. Apparatus for printing on a substrate on which a matrix of color elements is defined, the color elements having respective center lines, the apparatus comprising:

a printhead assembly, which is arranged to be positioned over the substrate, the printhead assembly comprising multiple controllable nozzles;

a translation assembly, which is arranged to translate at least one of the substrate and the printhead assembly so that the printhead assembly scans over the substrate in a scan direction transverse to the center lines of the color elements; and a controller, which is coupled to drive the printhead assembly to eject droplets of ink from the nozzles onto the substrate at selected times while the printhead assembly scans over the substrate, while selecting the times at which to eject the droplets so as to cause the droplets to land on the color elements at respective locations, such that respective locations are displaced from the center lines;

wherein the controller is adapted to select the times responsively to a repulsion between the droplets and at least one of the ink already deposited on the substrate and the ink in other droplets.

8. Apparatus for printing on a substrate on which a matrix of color elements is defined, the apparatus comprising:

a printhead assembly, which is arranged to be positioned over the substrate, the printhead assembly comprising multiple controllable nozzles;

a translation assembly, which is arranged to translate at least one of the substrate and the printhead assembly so that the printhead assembly scans over the substrate in a scan direction; and a controller, which is coupled to drive the printhead assembly to eject droplets of ink from the nozzles onto the substrate at selected times while the printhead assembly scans over the substrate so as to deposit two or more of the droplets on each of the color elements during a single pass of the printhead over the color elements, while selecting the times at which to eject the droplets so as to cause the droplets to land on the color elements so that the two or more of the droplets overlap and coalesce within each of the color elements on the substrate;

wherein the controller is operative to select the times so that the two or more of the droplets are deposited within a time limit that is determined responsively to a drying rate of the ink.

9. The apparatus according to claim 8, wherein the time limit is no greater than 200 ms.

10. The apparatus according to claim 9, wherein the time limit is no greater than 20 ms.

* * * * *